(12) United States Patent
Kwak

(10) Patent No.: US 8,164,545 B2
(45) Date of Patent: *Apr. 24, 2012

(54) ORGANIC ELECTRO-LUMINESCENT DISPLAY DEVICE AND METHOD OF MANUFACTURING THE SAME

(75) Inventor: Won-Kyu Kwak, Seongnam-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 905 days.

This patent is subject to a terminal disclaimer.

(21) Appl. No.: 12/155,398

(22) Filed: Jun. 3, 2008

(65) Prior Publication Data

US 2008/0272992 A1 Nov. 6, 2008

Related U.S. Application Data

(63) Continuation of application No. 11/052,108, filed on Feb. 8, 2005, now Pat. No. 7,456,811.

(30) Foreign Application Priority Data

Feb. 14, 2004 (KR) .................................. 2004-9842

(51) Int. Cl.
G09G 3/30 (2006.01)
H01J 1/62 (2006.01)

(52) U.S. Cl. ............. 345/76; 345/55; 345/80; 345/205; 345/206; 345/211; 313/498; 313/505; 313/506; 315/169.1; 315/169.3

(58) Field of Classification Search ............ 345/33, 345/44, 45, 55, 76, 80, 82, 204, 205, 206, 345/211; 257/49, 52, 57, 59, 66, 72, E27.111, 257/E25.151; 438/142, 149; 315/169.1, 315/169.3; 313/498, 505, 506
See application file for complete search history.

(56) References Cited

U.S. PATENT DOCUMENTS

| 6,859,193 | B1 | 2/2005 | Yumoto |
| 6,921,627 | B2 | 7/2005 | Tada et al. |
| 7,309,958 | B2 | 12/2007 | Kim et al. |
| 7,324,075 | B2 | 1/2008 | Sano et al. |
| 7,456,811 | B2 * | 11/2008 | Kwak ............................ 345/76 |
| 2002/0158835 | A1 | 10/2002 | Kobayashi et al. |
| 2003/0151355 | A1 | 8/2003 | Hosokawa |
| 2005/0146264 | A1 | 7/2005 | Kwak et al. |

FOREIGN PATENT DOCUMENTS

| EP | 1 109 224 | 6/2001 |
| JP | 11-214161 | 8/1999 |
| JP | 2002-246185 | 8/2002 |
| JP | 2003-232244 | 8/2002 |
| JP | 2002-318556 | 10/2002 |
| JP | 2003-15548 | 1/2003 |
| JP | 2003-303687 | 10/2003 |
| KR | 10-2002-0082138 | 10/2002 |

OTHER PUBLICATIONS

Society for Information Display International Symposium, Seminar & Exhibition Session 54, May 18-23, 2003, Baltimore, MD; http://www.sid.org/conf/sid2003/advprg/54.html (Feb. 7, 2005), Listing Only.
Korean Office action for Korean Patent Application No. 10-2004-0009842, issued on Nov. 28, 2005.
Japanese Office Action corresponding to Japanese Patent Application No. 2005-036839, issued on Aug. 7, 2007.
*Search Report* from the European Patent Office in Applicant's corresponding European Patent Application No. 05090025.7-2203 dated Apr. 24, 2008.

* cited by examiner

*Primary Examiner* — My-Chau T Tran
(74) *Attorney, Agent, or Firm* — Robert E. Bushnell, Esq.

(57) ABSTRACT

An organic electroluminescence device which includes a power line formed on the same layer as source and drain electrodes of a thin film transistor (TFT) and formed on a substrate on which the TFT is formed, a first insulating layer formed on the TFT, a lower electrode that electrically connected to one of the source and drain electrodes of the TFT and disposed on the first insulating layer, a first auxiliary power line and a second auxiliary power line formed on the same layer as the lower electrode in the second insulating layer, a second insulating layer formed on an edge portion of the lower electrode and not formed on the second auxiliary power line, wherein an opening that exposes a portion of the lower electrode is formed, an organic film formed on a substrate; and an upper electrode formed on the substrate.

19 Claims, 8 Drawing Sheets

ORGANIC ELECTRO-LUMINESCENT DISPLAY DEVICE AND METHOD OF MANUFACTURING THE SAME

CLAIM OF PRIORITY AND CROSS-REFERENCE TO RELATED APPLICATION

This application claims the priority of Korean Patent Application No. 10-2004-0009842, filed on Feb. 14, 2004, in the Korean Intellectual Property Office, the disclosure of which is incorporated herein in its entirety by reference. Furthermore, this application is a continuation of Applicants' Ser. No. 11/052,108 filed in the U.S. Patent & Trademark Office on 8 Feb. 2005, which is now U.S. Pat. No. 7,456,811, and assigned to the assignee of the present invention.

BACKGROUND OF THE INVENTION

1. Field of the Invention

The present invention relates to an organic electroluminescence display device and a method of manufacturing the same, and more particularly, to an organic electroluminescence display device that can be formed with a large size screen and can prevent non-uniform brightness of a panel using an auxiliary power line to prevent a voltage drop of a power line and an upper electrode and a method of manufacturing the same.

2. Description of the Related Art

Since organic electroluminescence display (OELD) devices are emissive display devices that emit light by electrically exciting an organic fluorescent compound, can be driven at a low driving voltage, are slim and lightweight, and have a wide viewing angle and a quick response time, they are expected to solve the problems of and replace liquid crystal display devices.

An OELD device generally includes an organic film (or layer) formed in a predetermined pattern and placed on a transparent insulating substrate formed of glass or other material and electrodes formed on and under the organic film. The organic film is formed of an organic compound. In the above structure of the OELD device, when a positive voltage and a negative voltage are applied to the electrodes, holes migrate to a light emitting layer via a hole transport layer (HTL) from the electrode to which the positive voltage is applied, electrons migrate to the light emitting layer via an electron transport layer (ETL) from the electrode to which the negative voltage is applied. Excitons are generated by combining the holes and electrons in the light emitting layer and the excitons change to a ground state while being excited. Thus, an image is formed by light emitted from fluorescent molecules of the light emitting layer.

An active matrix (AM) organic electroluminescence display device includes at least two thin film transistors (TFTs) in each pixel. The TFTs are used as a switching device that controls the operation of the pixel and a driving device that drives the pixel. The TFTs have a semiconductor active layer having source and drain regions doped with a high concentration of dopant and a channel region formed between the source and drain regions. The TFT is composed of a gate insulating layer formed on the semiconductor active layer, a gate electrode formed on the gate insulating layer on the channel region of the semiconductor active layer, and, on the gate electrode, drain and source electrodes which are connected to the source and drain regions via contact holes through an inter-insulator.

FIG. 1 is a plan view of a pixel of an AM OELD device, and FIG. 2 is a cross-sectional view of the pixel of FIG. 1.

Referring to FIG. 1, the AM OELD device includes a plurality of sub-pixels. Each sub-pixel is arranged in a pixel region defined by a scan line (Scan), a data line (Data), and a driving line (VDD), and each of the sub-pixels can be simply formed of at least two TFTs, such as a switching TFT (TFTsw) and a driving TFT (TFTdr), one capacitor (Cst), and one organic light emitting diode (OLED). The numbers of TFTs and capacitor are not limited to two and one, respectively, and more than two TFTs and more than one capacitor can be included.

The switching TFT (TFTsw) transmits data signals applied to the data line Data by being driven by scanning signals applied to the scan line (Scan). The driving TFT (TFTdr) determines the amount of current inputted to the OLED through the power line VDD according to the data signals transmitted from the switching TFT (TFTsw), that is, a voltage difference Vgs between the gate and the source. The capacitor (Cst) stores data signals transmitted through the switching TFT (TFTsw) during one image frame.

FIG. 2 is a cross-sectional view of the pixel of FIG. 1. In FIG. 2, only an OELD and a TFT driving the OLED are illustrated.

Referring to FIG. 2, a buffer layer 110 is formed on a glass substrate 100, and a TFT and an OLED are formed on the buffer layer 110.

A semiconductor active layer 121 is formed in a predetermined pattern on the buffer layer 110 on the substrate 100. A gate insulating layer 130 formed of $SiO_2$ is formed on the semiconductor active layer 121, and a gate electrode 141 as a conductive film formed of MoW or Al/Cu is formed on the gate insulating layer 130. As depicted in FIG. 1, the gate electrode 141 is connected to one of an upper or a lower electrode of the capacitor (Cst).

An inter-insulator 150 is formed on the gate electrode 141, and the source and drain electrodes 161 are respectively connected to source and drain regions (not shown) in the semiconductor active layer 121 via contact holes. The power line VDD is also formed on the inter-insulator 150 when the source and drain electrodes 161 are formed. A passivation film 170 formed of $SiO_2$ or SiNx is formed on the source and drain electrodes 161 and a planarizing film 175 formed of an organic material such as acryl, polyimide, or BCB is formed on the passivation film 170.

Via-holes 175a and 170a connected to the source and drain electrodes 161 are formed in the passivation film 170 and the planarizing film 175 by photolithography or perforation. A lower electrode layer 180 that acts as an anode is formed on the planarizing film 175 and is connected to the source and drain electrodes 161. A pixel defining layer 185 formed of an organic material covering the lower electrode layer 180 is formed. After forming a predetermined opening in the pixel defining layer 185, an organic layer 190 is formed in a region defined by the opening. The organic layer 190 includes a light emitting layer. Next, an upper electrode layer 195, which acts as a cathode is formed to cover the organic layer 190. A portion of the organic layer 190 where the lower electrode layer 180 faces the upper electrode layer 195 emits light by receiving holes and electrons.

Conventionally, in the AM OELD device, a transparent cathode is used for emitting light toward a direction of a sealed substrate. Generally, the transparent cathode is formed of a transparent conductive material such as ITO or IZO. However, to function as a cathode, after thinly depositing a semitransparent metal film using a metal having low work function, such as MgAg, on a side that contacts the organic film, a thick transparent conductive film formed of ITO or IZO is deposited on the semitransparent metal film.

In a conventional method of manufacturing the OELD device, the transparent conductive film is formed after forming the organic film 190. At this time, the transparent conductive film is formed using a low temperature deposition process to minimize the damage of the organic film by heat or plasma. Therefore, the transparent conductive film has poor film quality and has a high specific resistance.

When the specific resistance of a cathode is high, a non-uniform cathode voltage can be applied to the pixels and can generate a voltage difference between a location close to the power supply point and a location remote from the power supply point due to a voltage drop. The voltage difference can cause non-uniform brightness and image characteristics, and increases power consumption. The voltage drop is also a reason that makes it difficult to manufacture a large size AM OELD device.

To solve this problem, Shoji Terada et al. have introduced a method of forming an auxiliary electrode for preventing a voltage drop of the upper electrode on a pixel defining layer 285 in 54.5 L, SID2003 (Society for Information Display International Symposium, Seminar & Exhibition, Session 54, May 18-23, 2003, Baltimore, Md.). The OELD device depicted in FIG. 1 has a structure in which an auxiliary electrode line 193 for preventing a voltage drop of the upper electrode is formed on the pixel defining layer 185 and the upper electrode 195 that acts as a cathode and is formed on an entire surface of the insulating substrate 100 contacts the auxiliary electrode line 193.

However, the OELD device can solve the problem of non-uniform brightness caused by the voltage drop by forming the auxiliary electrode line 193 but has drawbacks in that the organic film 190 can be damaged when forming the auxiliary electrode line 193 by patterning after forming the semitransparent metal film on the pixel defining layer 185. Also, this process is complicated since a mask process for forming the auxiliary electrode line 193 is added.

On the other hand, the power line (VDD) that inputs a current to the source and drain electrodes 161 is simultaneously formed and connected to the source and drain electrodes 161 when forming the source and drain electrodes 161. However, in the TFT structure, the wiring resistance is high due to a small cross-sectional area of the wiring since the wiring of the power line (VDD) is supplied from a side of the substrate. Therefore, the amount of current supplied to the driving TFT (TFTdr) is non-uniform due to an RC delay and voltage drop resulting in the non-uniform brightness of the OELD device.

As described above, due to the voltage drops in the power line (VDD) and cathode, the manufacturing of a large size AM OELD device is difficult.

SUMMARY OF THE INVENTION

It is therefore an object of the present invention to provide an improved OELD device.

It is also an object of the present invention to provide a method of manufacturing the OELD device.

It is still an object of the present invention to provide an OELD device that prevents voltage drops of a power line (VDD) and a cathode using an auxiliary power line and a method of manufacturing the same.

It is further an object of the present invention to provide an OELD device that can be formed in a large size by improving image characteristics and brightness thereof by preventing voltage drops of a power line (VDD) and a cathode and a method of manufacturing the same.

The above and other objects can be achieved by the present invention.

According to an aspect of the present invention, there is provided an OELD device comprising: a power line formed on the same layer as source and drain electrodes of a TFT and formed on a substrate on which the TFT is formed; a first insulating layer formed on the TFT; a lower electrode that is electrically connected to one of the source and drain electrodes of the TFT and disposed on the first insulating layer; a first auxiliary power line and a second auxiliary power line formed on the same layer as the lower electrode; a second insulating layer formed on an edge portion of the lower electrode and not formed on the second auxiliary power line, wherein an opening that exposes a portion of the lower electrode is formed in the second insulating layer; an organic film formed on a substrate; and an upper electrode formed on the substrate.

The first auxiliary power line is electrically connected to the power line.

The first insulating layer is interposed between the first auxiliary power line and the power line and the first auxiliary power line is electrically connected to the power line through a via-hole formed in the first insulating layer.

The second auxiliary power line is electrically connected to the upper electrode. The second auxiliary power line is electrically connected through a side surface to the upper electrode.

Preferably, the lower electrodes, the first auxiliary power line, and the second auxiliary power line can be formed of the same material. They can be formed of a conductive material having a greater work function than a conductive material for forming the upper electrode, and more preferably, can be formed of a material having a low specific resistance and high reflectance.

The lower electrode, the first auxiliary power line, and the second auxiliary power line can be formed as a single layer or a multiple layer and can be formed of Al-ITO, Mo-ITO, Ti-ITO, or Ag-ITO.

The lower electrode, the first auxiliary power line, and the second auxiliary power line can have a greater thickness than the organic film.

The OELD device can include a plurality of sub-pixels having the TFTs and power lines, and one portion of the sub-pixels includes the first auxiliary power line and the other portion of the sub-pixels includes the second auxiliary power line.

Each of the first auxiliary power lines can be formed to cross the power line of the sub-pixel which includes the first auxiliary power line. Also, each of the second auxiliary power lines can be formed to cross the power line of the sub-pixel which includes the second auxiliary power line. The first auxiliary power lines and the second auxiliary power lines of the sub-pixels can be alternately formed.

According to another aspect of the present invention, there is provided an OELD device comprising: a power line formed on the same layer as source and drain electrodes of a TFT and formed on a substrate that includes the TFT; a first insulating layer formed on the TFT; a lower electrode that is electrically connected to one of the source and drain electrodes of the TFT and disposed on the first insulating layer; a first auxiliary power line and a second auxiliary power line formed on the same layer as the lower electrode; a second insulating layer formed on an edge portion of the lower electrode and not formed on the second auxiliary power line, wherein an opening that exposes a portion of the lower electrode is formed in the second insulating layer; an organic film formed on the lower electrode in the opening; and an upper electrode formed on the substrate, wherein the second auxiliary power line is electrically connected to the upper electrode through a side surface and an upper surface of the second auxiliary power line.

According to another aspect of the present invention, there is provided a method of manufacturing an OELD device comprising: forming a lower electrode electrically connected to one of source and drain electrodes of a TFT on a substrate that includes the TFT and a power line formed on the same layer as the source and drain electrodes of the TFT and forming an auxiliary power line having a first auxiliary power line and a second auxiliary power line formed on the same layer as the lower electrode; forming a pixel defining film that includes an opening for exposing a portion of the lower electrode and is formed on an edge portion of the lower electrode and not on the second auxiliary power line; forming an organic film on the opening; and forming an upper electrode on the substrate.

The forming of the auxiliary power line includes: forming a planarizing film on the substrate that includes the TFT; forming a first via-hole that exposes the one of the source and drain electrodes of the TFT and a second via-hole that exposes the power line in the planarizing film; and forming the lower electrodes electrically connected to the one of the source and drain electrodes through the first via-hole and a first auxiliary power line electrically connected to the power line through the second via-hole and a second auxiliary power line one the planarizing film.

The first via-hole and a second auxiliary power line can be formed at the same time. The lower electrode, the first auxiliary power line, and the second auxiliary power line formed on the planarizing film may be formed of the same material.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
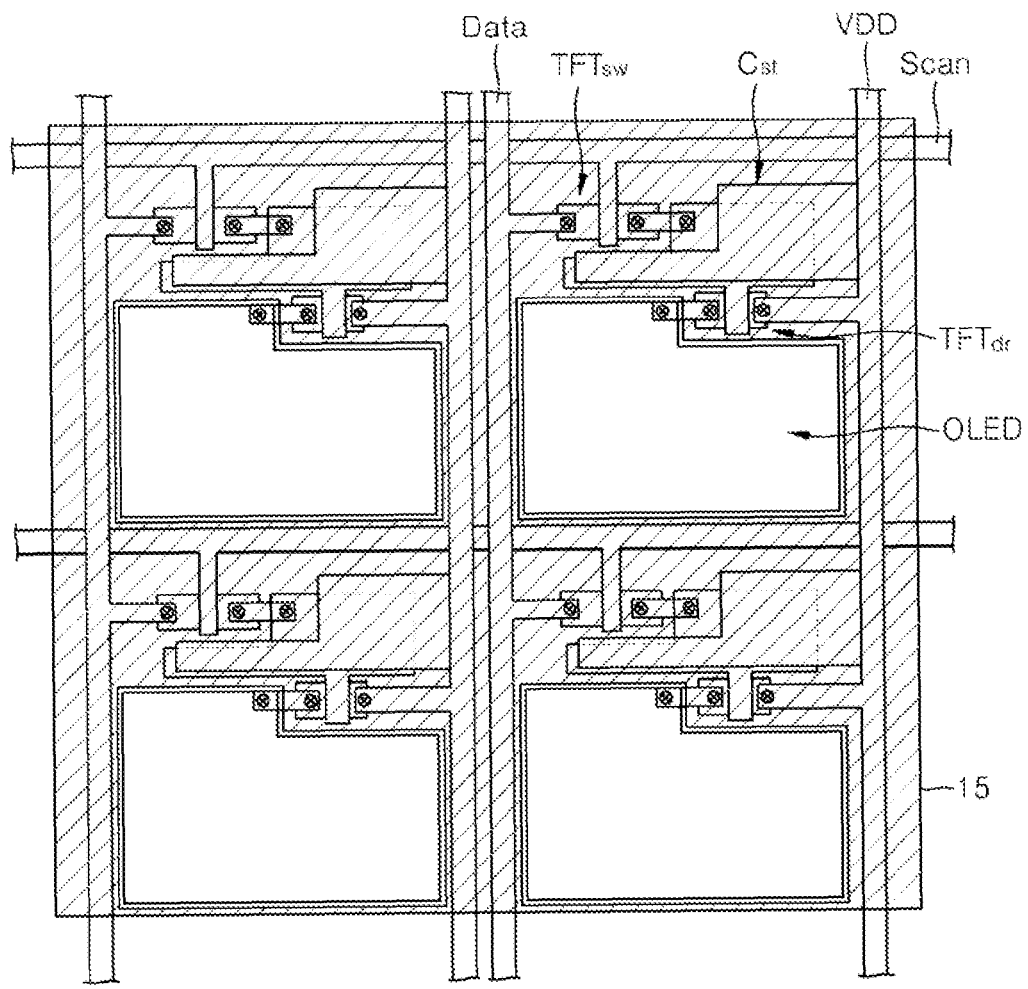
FIG. 1 is a plan view of a conventional front face emitting active matrix organic electroluminescence display (AM OELD) device.
Figure 2:
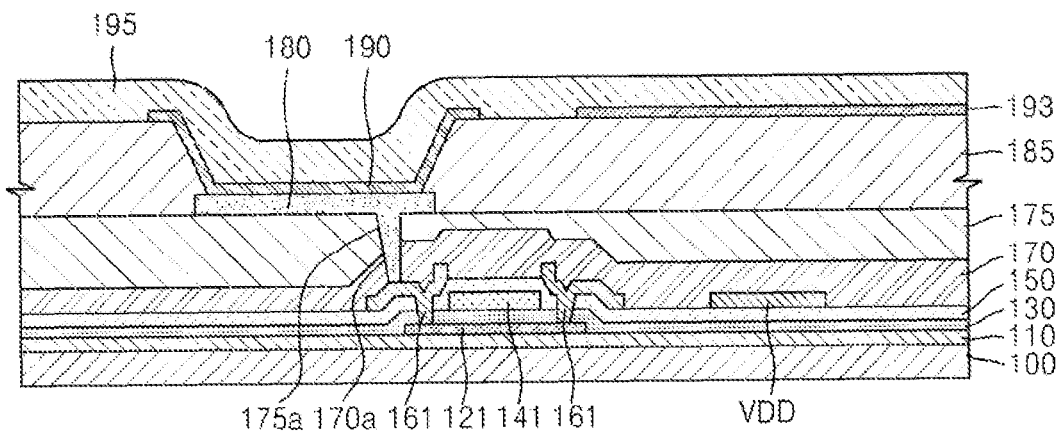
FIG. 2 is a cross-sectional view of a pixel of FIG. 1.

The present invention will now be described more fully with reference to the accompanying drawings in which exemplary embodiments of the invention are shown.

In the drawings and the specification, when a layer is shown or described as placed on another layer or on a substrate in order to indicate that a layer is either directly formed upon the other layer or on the substrate, or, alternatively, that a layer is formed on a third layer which, in turn, rests upon either the other layer or the substrate.

Figure 3:
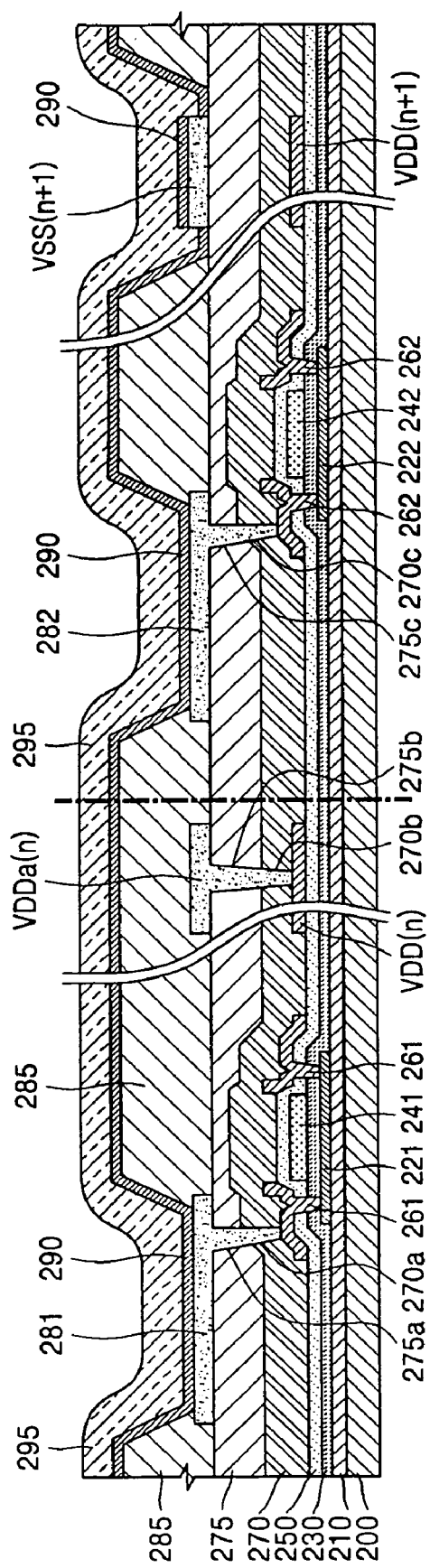
FIG. 3 is a cross-sectional view showing structures of pixels arranged in an nth column and (n+1)th column of an OELD device according to a first embodiment of the present invention.

FIG. 3 is a cross-sectional view showing structures of pixels arranged in an nth column and (n+1)th column of an OELD device according to a first embodiment of the present invention.

Referring to FIG. 3, the OELD device according to a first embodiment of the present invention includes a buffer layer 210 formed on a substrate 200, a thin film transistor (TFT) (hereinafter a first TFT) of a pixel arranged in an nth column and a TFT (hereinafter a second TFT) of a pixel arranged in an (n+1)th column. The first and second TFTs are disposed on the buffer layer 210. The substrate can be an insulating substrate that includes glass or plastic or a metal substrate.

The first TFT includes a semiconductor active layer 221, a gate electrode 241, source and drain electrodes 261, and the second TFT includes a semiconductor active layer 222, a gate electrode 242, and source and drain electrodes 262.

A gate insulating layer 230 is formed between the semiconductor active layers 221 and 222 and the gate electrodes 241 and 242, and the source and drain electrodes 261 and 262 are formed on the inter-insulator 250 and respectively connected to the semiconductor active layer 221 and 222 through each contact hole. Also, power lines (VDD(n) and VDD(n+1)) are formed on the inter-insulator 250 at the same level as the source and drain electrodes 261 and 262.

Each of the nth power line (VDD(n)) and the (n+1)th power line (VDD(n+1)) is connected in common to a plurality of pixels arranged in a same column, that is, the same data line. That is, as depicted in FIG. 3, the nth power line (VDD(n)) is extended to connect in common to a plurality of pixels arranged in the nth column, and the (n+1)th power line (VDD (n+1)) is extended to connect in common to a plurality of pixels arranged in the (n+1)th column.

A passivation film 270 formed of $SiO_2$ or SiNx and a planarizing film 275 formed of an organic film of acryl, polyimide, or BCB are formed on the substrate 200 on which the first and second TFTs are formed. A lower electrode 281 that acts as an anode of an OLED (a first OLED) of a pixel arranged in the nth column and a lower electrode 282 that acts as an anode of an OLED (a second OLED) of a pixel arranged in the (n+1)th column are formed on the planarizing film 275. The lower electrode 281 is electrically connected to one of the source and drain electrodes 261 of the first TFT through via-holes 270a and 275a, and the lower electrode 282 is electrically connected to one of the source and drain electrodes 262 of the second TFT through via-holes 270c and 275c.

Also, a first auxiliary power line (VDDa(n)) and a second auxiliary power line (VSS(n+1)) are formed on the planarizing film 275 at the same level as the lower electrodes 281 and 282 of the first and second OLEDs.

The first auxiliary power line (VDDa(n)) is formed on the same layer as the lower electrodes 281 and 282, and reduces the resistance of the nth power line (VDD(n)) by electrically connecting to the nth power line (VDD(n)) through the via-holes 270b and 275b. In FIG. 3, for a better understanding, the first auxiliary power line (VDDa(n)) is shown rotated by 90 degrees. In fact, the first auxiliary power line (VDDa(n)) has a structure that extends along a scan line.

The second auxiliary power line (VSS(n+1)) is formed on the same level as the lower electrodes 281 and 282, and reduces the resistance of the upper electrode 295 by electrically connecting to the upper electrode 295. In FIG. 3, for a better understanding, the second auxiliary power line (VSS(n+1)) is shown rotated by 90 degrees. In fact, the second auxiliary power line (VSS(n+1)) has a structure that extends along the first auxiliary power line (VDD(n)).

Figure 8:
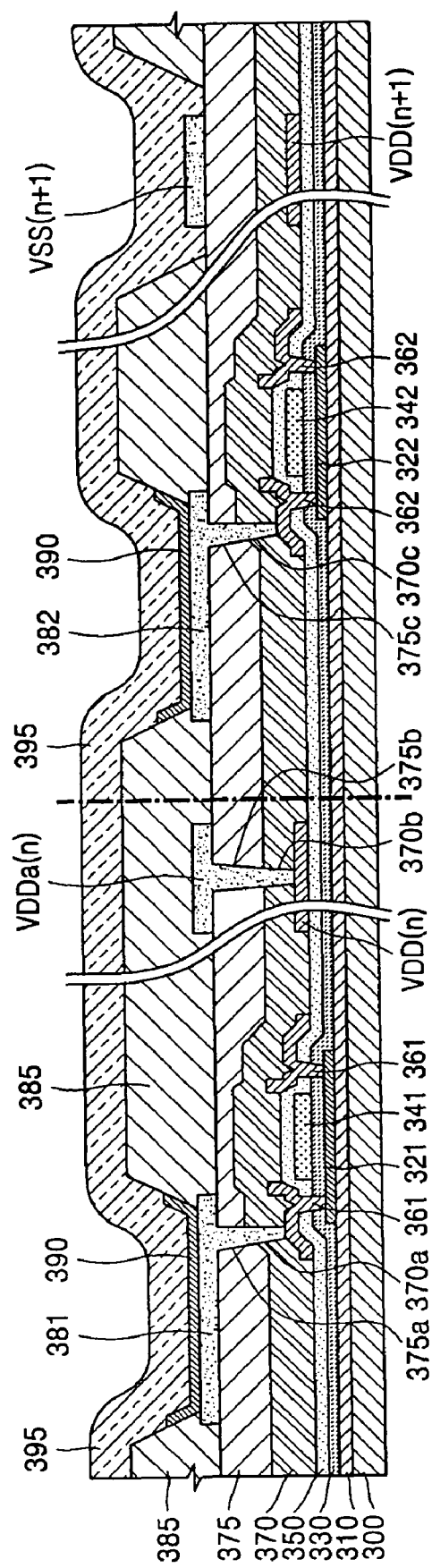
FIG. 8 is a cross-sectional view showing structures of pixels arranged in an nth column and (n+1)th column of an OELD device according to a second embodiment of the present invention.

A pixel defining film 285 is formed on a predetermined region including an edge portion of the lower electrodes 281 and 282. The pixel defining film 285 is formed not to be disposed on the second auxiliary power line (VSS(n+1)). When patterning the pixel defining film 285, openings are formed by exposing portions of the lower electrodes 281 and 282. The organic film 290 is formed on the entire substrate or on the openings. As depicted in FIG. 3, in the present embodiment, the organic film 290 is formed on the entire region on the substrate, but an organic film 290 can be formed only on the openings as depicted in FIG. 8.

The organic film 290 is not formed on a side surface of the second auxiliary power line (VSS(n+1)) but exposes the side surface of the second auxiliary power line (VSS(n+1)). An upper electrode 295 that acts as a cathode of the first and second OLEDs is formed on the organic film 290. The organic film 290 is electrically connected to the side surface of the second auxiliary power line (VSS(n+1)) since the side surface of the second auxiliary power line (VSS(n+1)) is not covered by the organic film 290.

At this time, not to form the organic film 290 on side surfaces of the second auxiliary power line (VSS(n+1)), the organic film 290 is coated after forming the second auxiliary power line (VSS(n+1)) with a thickness of greater than 3000 Å. The organic film 290 can be coated on the pixel defining film 285 since the pixel defining film 285 is formed with a certain taper angle. However, the side surfaces of the second auxiliary power line (VSS(n+1)) are not completely covered by the organic film 290 since the side surfaces of the second auxiliary power line (VSS(n+1)) are formed almost vertically and much thicker than the organic film 290.

The lower electrodes 281 and 282 that act as anodes, the first auxiliary power line (VDDa(n)), the second auxiliary power line (VSS(n+1)) can be formed of the same material. Also, they can be formed of a conductive material having greater work function than a material for forming the upper electrode 295 that acts as a cathode, for example, after forming a reflection film using Ag, Mg, Al, Pt, Pd, Au, Ni, Nd, Ir, Cr, or a compound of these metals, a transparent conductive film can be formed on the reflection film using ITO, IZO, or $In_2O_3$. Preferably, the lower electrodes 281 and 282, the first auxiliary power line (VDDa(n)), and the second auxiliary power line (VSS(n+1)) can be formed of a material having a low specific resistance of 1 to 20 μΩcm for reducing the voltage drop of the power line (VDD) and the cathode, and a material having high reflectance of 70 to 99.9% for increasing the reflectance of the organic film 290 which will be formed in a subsequent process, such as Al-ITO, Mo-ITO, Ti-ITO, or Ag-ITO or a material that can be used for forming a reflection film or an anode.

Also, the lower electrodes 281 and 282, the first auxiliary power line (VDDa(n)), and the second auxiliary power line (VSS(n+1)) can be formed as a single layer or a multiple layer.

The organic film 290 formed on the opening can be a low molecular weight organic layer or a polymer layer. When the organic film 290 is a low molecular weight organic layer, the organic film 290 may be a hole injection layer (HIL), a hole transport layer (HTL), an emission layer (EML), an electron transport layer (ETL), an electron injection layer (EIL) or a combination of these layers and can be composed of copper phthalocyanine (CuPc), N,N'-Di(naphthalene-1-yl)-N, N'-diphenyl-benzidine (NPB), or tris-8-hydroxyquinoline aluminum (Alq3). The low molecular weight organic layer can be formed using an evaporation method.

If the organic film 290 is a polymer organic layer, the organic film 290 can be an HTL and an EML. The HTL can be formed of poly-(2,4)-ethylene-dihydroxy thiophene (PEDOT) and the EML can be formed of a polymer such as Poly-Phenylenevinylene (PPV), or Polyfluorene and can be formed using a screen printing or an inkjet printing.

The organic film is not limited thereto, but a variety of embodiments can be applied.

The upper electrode 295 formed on the organic film 290 can be used as a transparent electrode or a reflection electrode. When the upper electrode 295 is used as the transparent electrode since the upper electrode 295 acts as a cathode, after depositing a metal layer using a metal having a low work function, such as Li, Ca, LiF/Ca, LiF/Al, Al, Mg, or a compound of these metals, a transparent electrode material can be formed on the metal layer using ITO, IZO, ZnO or $In_2O_3$. When the upper electrode 295 is used as the reflection electrode, the upper electrode 295 can be formed entirely depositing a metal layer using a metal having low work function, such as Li, Ca, LiF/Ca, LiF/Al, Al, Mg, or a compound of these metals. In the present embodiment, the upper electrode 295 in the front face emitting OELD device can be formed by forming an IZO film on an MgAg metal layer having low work function and low electrical resistance.

The upper electrode 295 is electrically connected to the side surfaces of the second auxiliary power line (VSS(n+1)) since the side surfaces of the second auxiliary power line (VSS(n+1)) are exposed, thereby preventing the voltage drop of the cathode.

FIG. 8 is a cross-sectional view showing structures of pixels disposed in an nth column and an (n+1)th column of an OELD device according to a second embodiment of the present invention.

The AM OELD device depicted in FIG. 8 has a similar structure with the AM OELD device of the first embodiment. The difference between them is that the organic film 290 in the first embodiment is formed on the entire surface of the substrate, and the upper electrode 295 is electrically connected to the side surfaces of the second auxiliary power line (VSS(n+1)), but an upper electrode 395 in the second embodiment is electrically connected to the side surfaces and the upper surface of the second auxiliary power line (VSS(n+1)) since an organic film 390 in the second embodiment is formed only on lower electrodes 381 and 382 not on the second auxiliary power line (VSS(n+1)).

At this time, the organic film 390 can be formed only on the opening of a pixel defining film 385 formed on an edge portion of the lower electrodes 381 and 382 by a method such as laser induced thermal imaging (LITI) transferring or patterning. That is, unlike in the first embodiment, the organic film 390 is not formed on the second auxiliary power line (VSS(n+1)).

Therefore, the voltage drop of the upper electrode 395 can be prevented by electrically connecting the upper electrode 395 to both side surfaces and the upper surface of the second auxiliary power line (VSS(n+1)) that prevents the voltage drop of the upper electrode 395.

Figure 9:
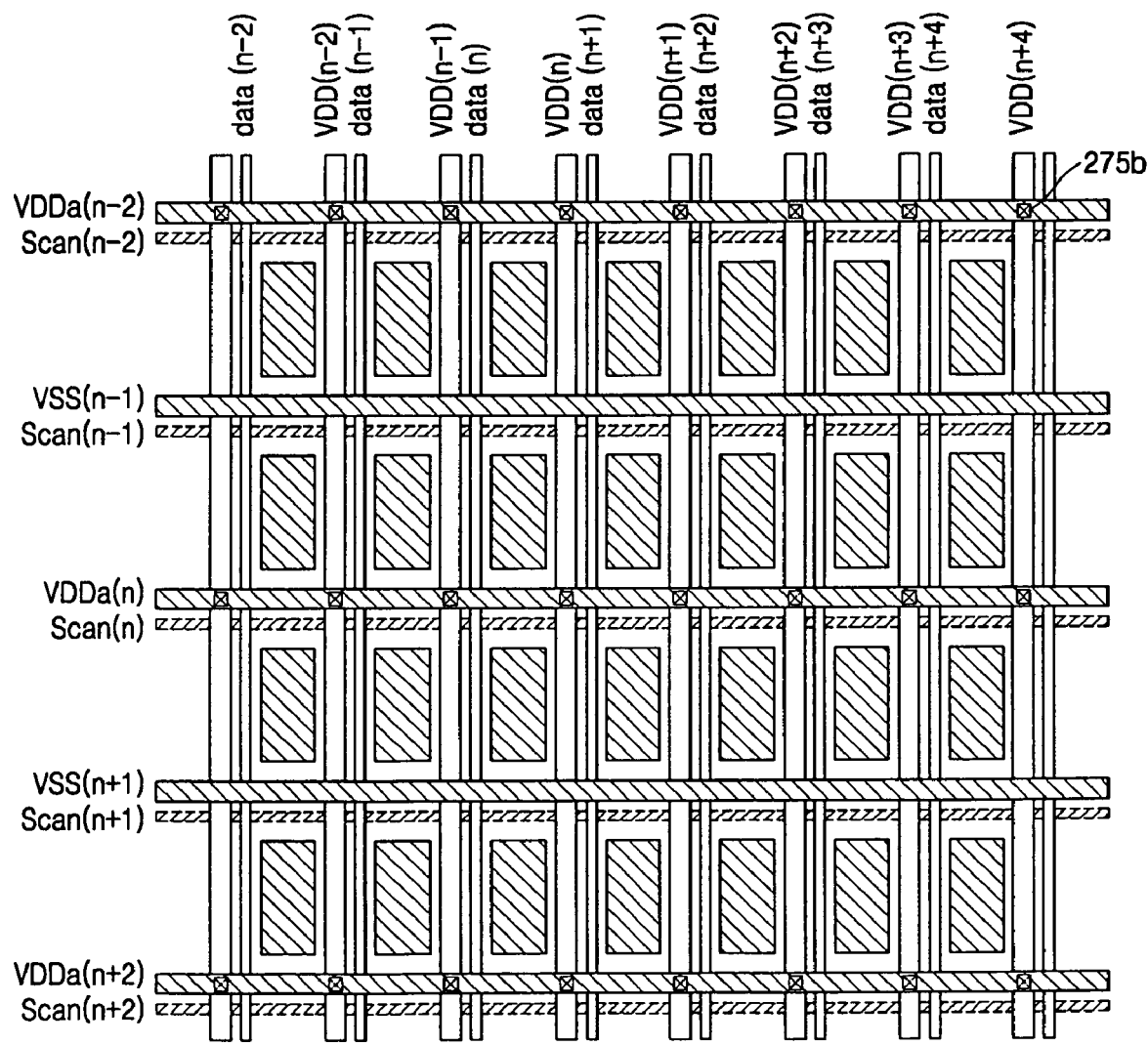
FIG. 9 is a plan view of an OELD device according to an embodiment of the present invention.

FIG. 9 is a plan view of an OELD device according to an embodiment of the present invention.

Referring to FIG. 9, an OELD device has a matrix shape of rows and columns having a plurality of sub-pixels, in which TFTs, lower electrodes, an organic layer, and an upper electrode are included. Conventionally, each pixel is composed of R, G, B sub-pixels, but is not necessarily limited thereto. The sub-pixels in the same column are connected to the same power line (VDD) and data line (Data). The sub-pixels in the same row are connected to the same scan line (Scan). The sub-pixels in the same row are connected to a first auxiliary power line (VDDa) or a second auxiliary power line (VSS), which is formed to cross the power line (VDD). The first auxiliary power line (VDDa) is electrically connected to the power line (VDD) by the via-holes 270b and 275b.

One portion of the sub-pixels are connected to the first auxiliary power line (VDDa), and the other portion of the sub-pixels are connected to the second auxiliary power line (VSS). In this manner, the sub-pixels form a mesh shape.

In the embodiment depicted in FIG. 9, the first auxiliary power line (VDDa) and the second auxiliary power line (VSS) are alternately formed in each row. However, the number of the first auxiliary power lines (VDDa) can be increased if the voltage drop (IR drop) of the power line (VDD) is needed to be taken into consideration, and the number of the second auxiliary power lines (VSS) can be increased if the voltage drop of the cathode is needed to be taken into consideration.

A method of manufacturing an OELD device according to an embodiment of the present invention will now be described with reference to the FIGS. 4A through 7B.

Figure 4A:
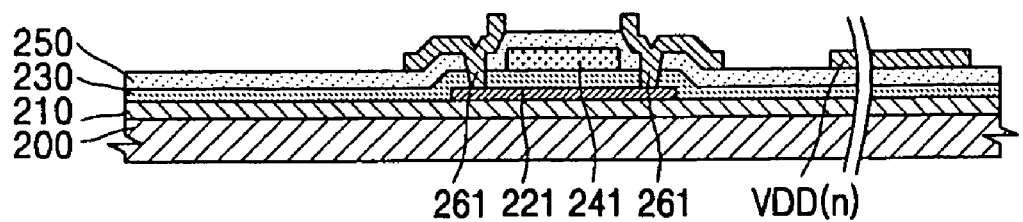
FIGS. 4A and 4B are cross-sectional views illustrating a method of manufacturing an OELD device according to an embodiment of the present invention.
Figure 4B:
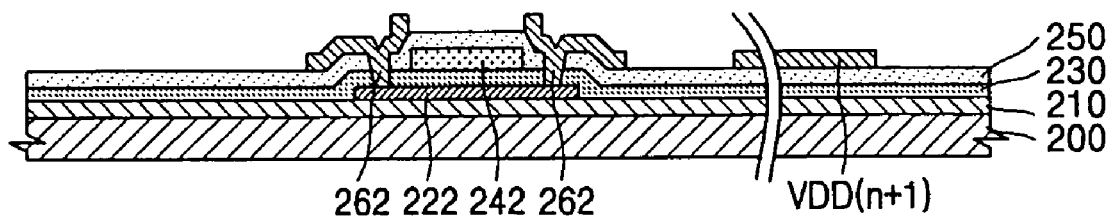

FIGS. 4A and 4B are cross-sectional views illustrating a method of manufacturing an OELD device, in which first and second TFTs and a power line are formed on a substrate, according to an embodiment of the present invention.

A buffer layer 210 is formed on an insulating substrate formed of glass or plastic or a metal substrate. When the buffer layer 210 is formed, the penetration of impurity elements is prevented and a surface is planarized. The buffer layer 210 can be formed of $SiO_2$ or SiN using plasma enhanced chemical vapor deposition (PECVD), atmospheric pressure chemical vapor deposition (APCVD), low pressure chemical vapor deposition (LPCVD), or electron cyclotron resonance (ECR) in a thickness of approximately 3000 Å. After forming semiconductor active layers 221 and 222 on the buffer layer 210, ions are doped to the semiconductor active layers 221 and 222. Afterward, a gate insulating layer 230 is formed on the semiconductor active layers 221 and 222 and gate electrodes 241 and 242 are formed on the gate insulating layer 230. Next, source and drain electrodes 261 and 262 that contact the semiconductor active layers 221 and 222 through via-holes are formed. This completes the manufacturing of the first and second TFTs.

More specifically, the semiconductor active layers 221 and 222 can be formed of an inorganic semiconductor or an organic semiconductor in a thickness of approximately 500 Å. When the semiconductor active layers 221 and 222 are formed of poly silicon of an inorganic semiconductor, after forming amorphous silicon, the amorphous silicon can be crystallized to a poly crystal by various crystallization methods. The active layer has source and drain regions highly doped with an N type or a P type dopant and a channel region is formed therebetween. The inorganic semiconductor can be a silicon material including CdS, GaS, ZnS, CdSe, CaSe, ZnSe, CdTe, SiC, a-Si (amorphous silicon), or poly-Si (poly silicon), and the organic semiconductor can be a semiconductor organic material having a band gap in a range of 1-4 eV and can include a poly organic material such as polythiophene or a low molecular weight organic material such as pentacene.

The gate insulating layer 230 formed of SiO2 is formed on the semiconductor active layers 221 and 222, and the gate electrodes 241 and 242 formed of a conductive metal, such as MoW, Al, Cr, or Al/Cu, are formed on a predetermined region on the gate insulating layer 230. The material for forming the gate electrodes 241 and 242 are not limited thereto, and they can be formed of various conductive materials such as conductive polymer. The region where the gate electrodes 241 and 242 are formed is a region corresponding to a channel region of the semiconductor active layers 221 and 222.

An inter-insulator 250 formed of $SiO_2$ or SiNx is formed on the gate electrodes 241 and 242, and the source and drain electrodes 261 and 262 are formed on the inter-insulator 250 after forming a contact hole in the inter-insulator 250 and the gate insulating layer 230. The source and drain electrodes 261 and 262 can be formed of a conductive metal film such as MoW, Al, Cr, or Al/Cu or a conductive polymer. The power lines (VDD(n) and VDD(n+1)) are formed on the inter-insulator 250 at the time the source and drain electrodes 261 and 262 are formed. The power line (VDD) can be formed of the same material or a different material for forming the source and drain electrodes 261 and 262.

The structure of the TFT is not limited to the above descriptions. The conventional TFTs can also be employed.

Figure 5A:
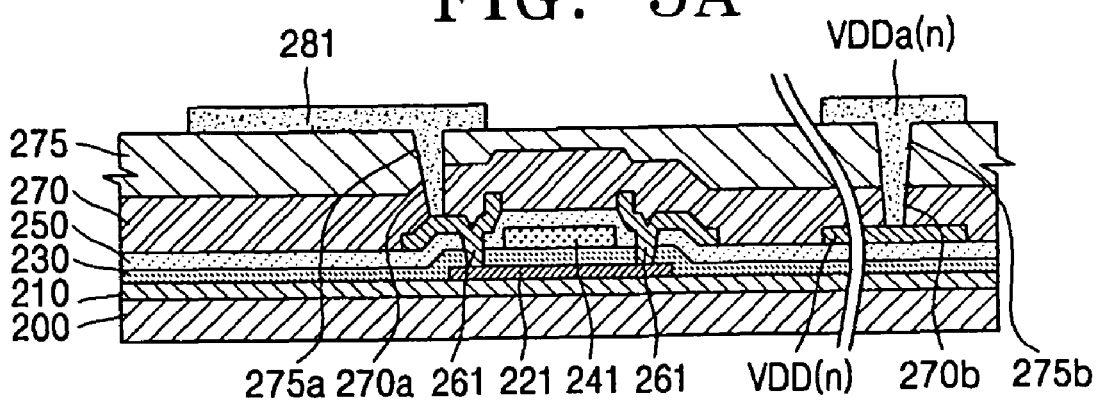
FIGS. 5A and 5B are cross-sectional views illustrating a method of manufacturing an OELD device according to an embodiment of the present invention.
Figure 5B:
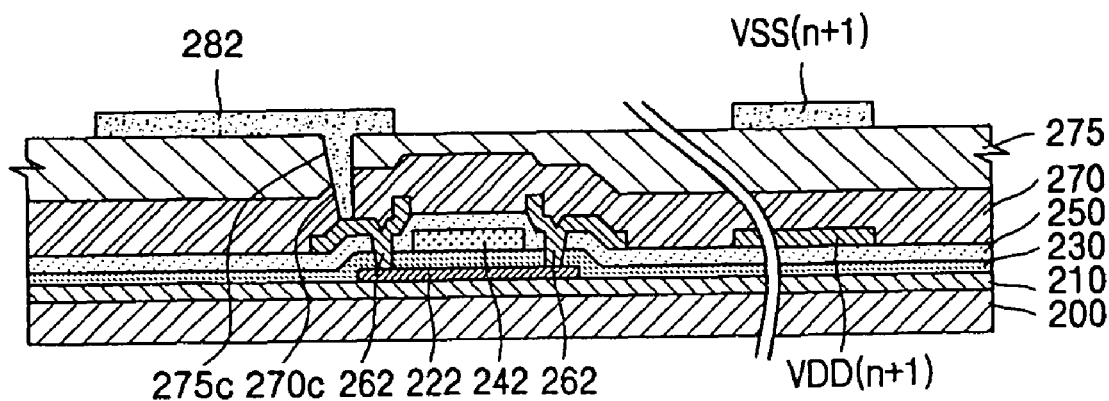

Next, referring to FIGS. 5A and 5B, the lower electrodes 281 and 282 electrically connected to one of the source and drain electrodes 261 and 262 of the TFTs are formed on the substrate 200 that includes TFTs and the power line (VDD) formed on the same layer as the source and drain electrodes 261 and 262 of the TFTs. The first and second auxiliary power lines (VDDa and VSS) are formed on the same layer as the lower electrodes 281 and 282.

The first auxiliary power line (VDDa) is formed on the same layer as the lower electrodes 281 and 282, but it is electrically connected to the power line (VDD(n)) through via-holes 270b and 275b. In FIG. 5A, for a better understanding, the first auxiliary power line (VDDa(n)) is shown rotated by 90 degrees. In fact, the first auxiliary power line (VDDa (n)) has a structure that extends along the scan line (Scan).

Also, in FIG. 5B, for a better understanding, the second auxiliary power line (VSS(n+1)) is shown rotated by 90 degrees. In fact, the second auxiliary power line (VSS(n+1)) has a structure that extends along the scan line (Scan).

The lower electrodes 281 and 282, the first auxiliary power line (VDDa(n)), and the second auxiliary power line (VSS (n+1)) are formed on a passivation film 270 and a planarizing film 275 coated on the TFT.

The passivation film 270 is formed of SiNx on the source and drain electrodes 261 and 262, and the planarizing film 275 is formed of acryl, BCB, or polyimide on the passivation film 270. In a sub-pixel of the nth column, via-holes 270a and 275a are formed in the passivation film 270 and the planarizing film 275 to expose the source and drain electrodes 261 and 262. Next, the lower electrode 281 of the first OLED is formed on the passivation film 270 and the lower electrode 281 is connected to one of the source and drain electrodes 261 through the via-holes 270a and 275a.

In a sub-pixel of the nth column, other via-holes 270b and 275b for exposing the power line (VDD(n)) are formed at the time when the via-holes 270a and 275a are formed. The first auxiliary power line (VDDa(n)) is formed to be connected to the power line (VDD(n)) through the via-holes 270b and 275b at the same time when the lower electrode 281 is formed on the planarizing film 275.

Also, via-holes 270c and 275c for exposing the source and drain electrodes 262 are formed in a pixel of the (n+1)th column on the passivation film 270 and the planarizing film 275 at the same time when the via-holes 270a and 275a are formed in a pixel of the nth column. Also, in the pixel of an (n+1)th column, the lower electrode 282 of the second OLED is formed in the pixel of an (n+1)th column, and the lower electrode 282 is connected to one of the source and drain electrodes 262 through the via-holes 270c and 275c at the same time when the lower electrode 281 of the first OLED is formed on the planarizing film 275 in a pixel of the nth column. Also, the second auxiliary power line (VSS(n+1)) is formed on the power line (VDD(n+1)) in a sub-pixel of the n+1th column at the same time when the lower electrodes 281 and 282 are formed on the planarizing film 275.

The lower electrodes 281 and 282 used as anodes, the first auxiliary power line (VDDa), and the second auxiliary power line (VSS) can be formed of the same material, and can be formed of a conductive material having a greater work function than a material for forming the upper electrode 295 that acts as a cathode. For example, after forming a reflection film using a metal such as Ag, Mg, Al, Pt, Pd, Au, Ni, Nd, Ir, Cr, or a compound of these metals, the lower electrodes 281 and 282, the first auxiliary power line (VDDa), and the second auxiliary power line (VSS) can be formed by forming a layer using ITO, IZO, ZnO, or In2O3 on the reflection film.

More preferably, the lower electrodes 281 and 282, the first auxiliary power line (VDDa), and the second auxiliary power line (VSS) can be formed of a material having a low specific resistance for reducing the voltage drop of the power line (VDD) and the upper electrode 295 which acts as the cathode, and having high reflectance for increasing the reflectance of the organic film 290 which will be formed in a subsequent process, such as Al-ITO, Mo-ITO, Ti-ITO, or Ag-ITO or a material that can be used for forming a reflection film or an anode.

Also, the lower electrodes 281 and 282, the first auxiliary power line (VDDa), and the second auxiliary power line (VSS) can be formed as a single layer or a multiple layer. The manufacturing process can be reduced by forming the lower electrodes 281 and 282, the first auxiliary power line (VDDa (n)), and the second auxiliary power line (VSS(n+1)) at the same time. The lower electrodes 281 and 282, the first auxiliary power line (VDDa(n)), and the second auxiliary power line (VSS(n+1)) are formed as thick as possible so that the organic film 290, which will be coated on the second auxiliary power line (VSS(n+1)) in a subsequent process, can not cover side surfaces of the second auxiliary power line (VSS(n+1)). An upper electrode 295, which will be formed on the organic film 290 in a subsequent process, is electrically connected to the second auxiliary power line (VSS(n+1)) through the side surfaces of the second auxiliary power line (VSS(n+1)).

Figure 6A:
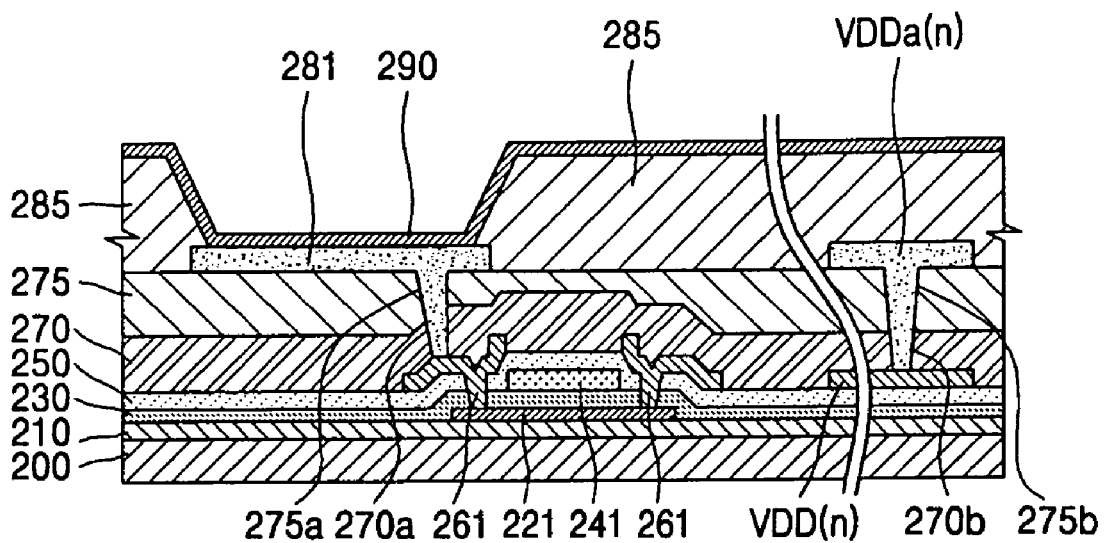
FIGS. 6A and 6B are cross-sectional views illustrating a method of manufacturing an OELD device according to an embodiment of the present invention.
Figure 6B:
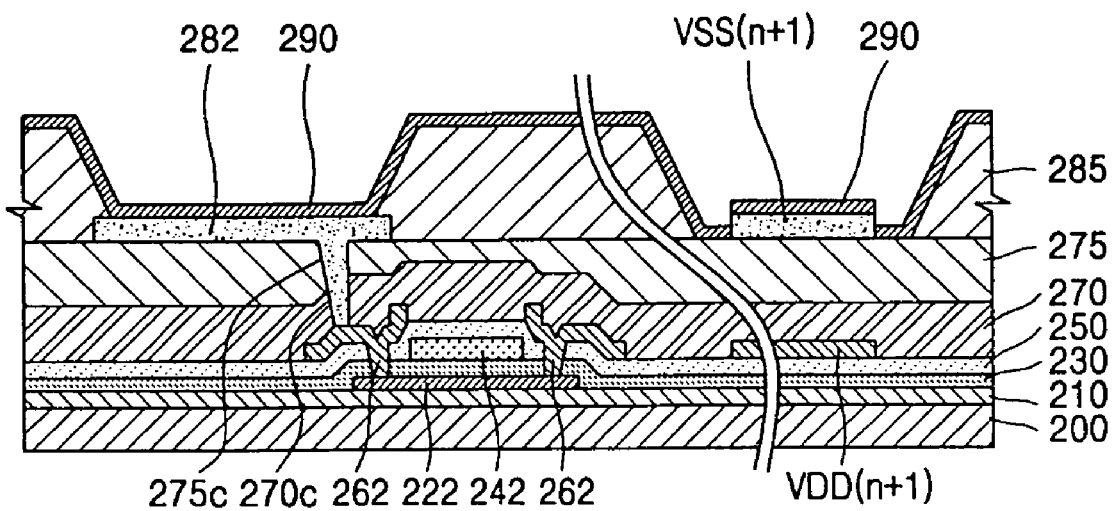

After forming the lower electrodes 281 and 282, the first auxiliary power line (VDDa(n)), and the second auxiliary power line (VSS(n+1)), a pixel defining film 285 is formed on edge portions of the lower electrodes 281 and 282 on the substrate 200. As depicted in FIGS. 6A and 6B, the pixel defining film 285 is not formed on the second auxiliary power line (VSS(n+1)). Openings that expose portions of the lower electrodes 281 and 282 are formed by forming the pixel defining film 285 on edge portions of the lower electrodes 281 and 282.

Afterward, an organic film 290 that includes a light emitting layer is coated on an entire surface of the insulating substrate 200. The organic film 290 is not formed on side surfaces of the second auxiliary power line (VSS(n+1)). On the other hand, an upper electrode 295 that acts as a cathode of an OLED is formed on the organic film 290. The upper electrode 295 is electrically connected to the second auxiliary power line (VSS(n+1)) through the side surfaces of the second auxiliary power line (VSS(n+1)) since the side surfaces of the second auxiliary power line (VSS(n+1)) are not covered by the organic film 290.

At this time, the forming of the organic film 290 on the side surfaces of the second auxiliary power line (VSS(n+1)) can be avoided such that the organic film 290 is coated on the second auxiliary power line (VSS(n+1)) after forming the second auxiliary power line (VSS(n+1)) to a thick thickness of greater than 3000 Å. The pixel defining film 285 is formed with a certain taper angle so that the organic film 290 can be coated, but the organic film 290 can not be formed on the side surfaces of the second auxiliary power line (VSS(n+1)) since the second auxiliary power line (VSS(n+1)) is formed to a much greater thickness than the thickness of the organic film 290 and the side surfaces of the second auxiliary power line (VSS(n+1)) is almost vertical.

Figure 7A:
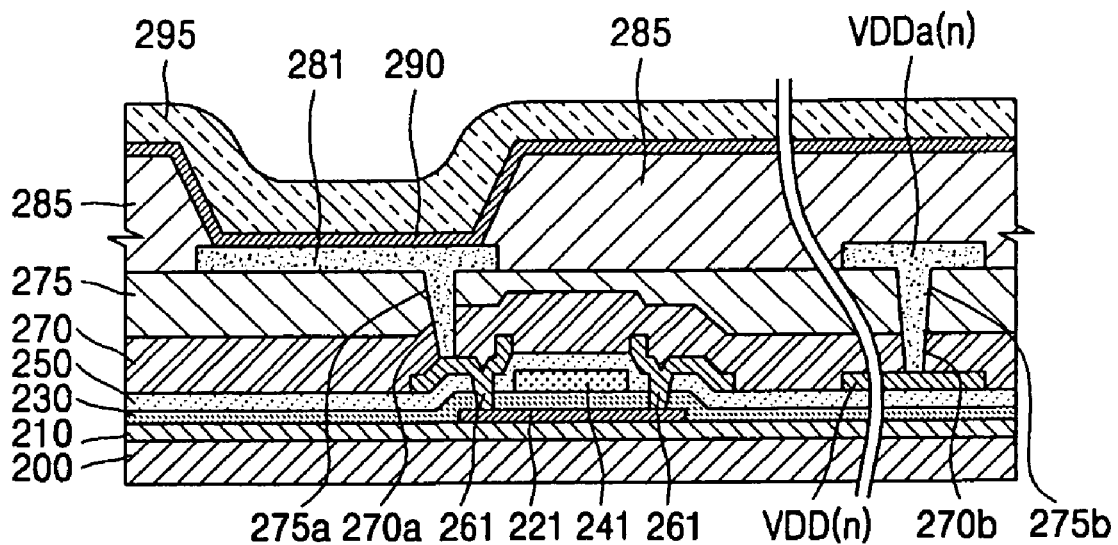
FIGS. 7A and 7B are cross-sectional views illustrating a method of manufacturing an OELD device according to an embodiment of the present invention.
Figure 7B:
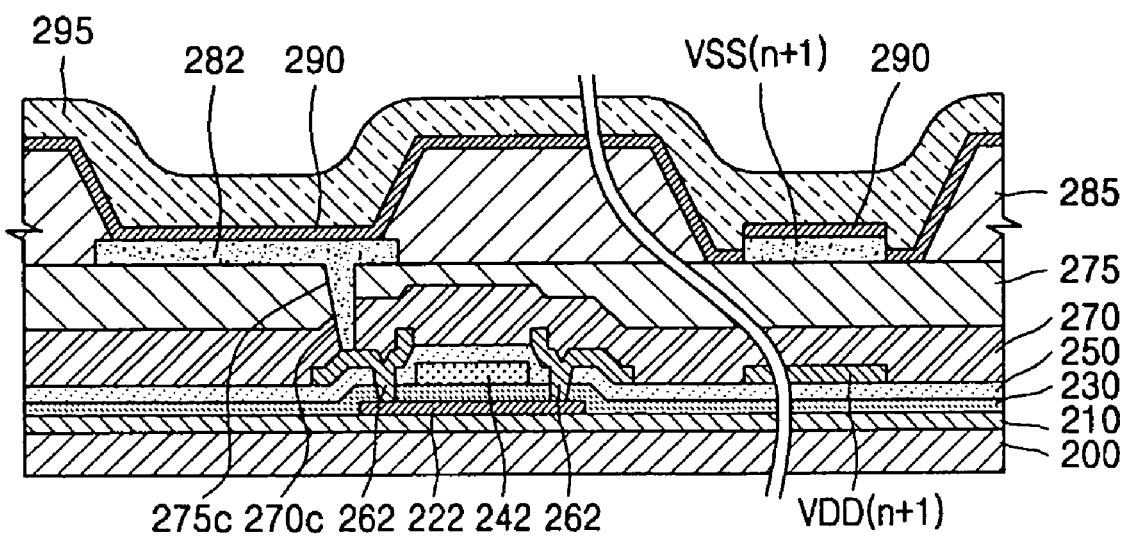

Next, referring to FIGS. 7A and 7B, the upper electrode 295 that acts as a cathode is formed on an entire surface of the substrate 200. The upper electrode 295 can be formed such that, after depositing a metal layer using a metal having a low work function, such as Li, Ca, LiF/Ca, LiF/Al, Al, Mg, or a compound of these metals, toward the organic film 290, a transparent electrode material, such as ITO, IZO, ZnO, or $In_2O_3$ can be formed on the metal layer. In the present embodiment, the upper electrode 295 can be formed by forming an IZO film on an MgAg metal layer having low work function and low electrical resistance.

The upper electrode 295 is electrically connected to the side surface of the second auxiliary power line (VSS(n+1)) by coating the upper electrode 295. As described above, the upper electrode 295 can be electrically connected to the second auxiliary power line (VSS(n+1)) since the side surfaces of the second auxiliary power line (VSS(n+1)) is formed thick enough not to be covered by the organic film 290.

The embodiment depicted in FIG. 8 shows that the organic film 390 is coated only on lower electrodes 381 and 382 and openings. Therefore, the side surfaces and an upper surface of the second auxiliary power line (VSS(n+1)) can contact the upper electrode 395. The rest of elements are identical to the first embodiment.

FIG. 9 is a plan view of an OELD device according to an embodiment of the present invention. Referring to FIG. 9, an OELD device has a matrix shape of rows and columns having a plurality of sub-pixels in which TFTs, the lower electrodes 281 and 282, the organic film 290, the upper electrode 295 are included. The sub-pixels in the same column are connected to the same power line (VDD) and data line (Data). The sub-pixels in the same row are connected to the same scan line (Scan). The sub-pixels in the same row are connected to a first auxiliary power line (VDDa) or a second auxiliary power line (VSS), which is formed to cross the power line (VDD). At this time, the first auxiliary power line (VDDa) is electrically connected to the power line (VDD) by the via-holes 270b and 275b.

One portion of the sub-pixels are connected to the first auxiliary power line (VDDa), and the other portions of the sub-pixels are connected to the second auxiliary power line (VSS). In this manner, the sub-pixels form a mesh shape on a plane.

In the present embodiment depicted in FIG. 9, the first auxiliary power line (VDDa) and the second auxiliary power line (VSS) are alternately formed in each row. However, the number of the first auxiliary power lines (VDDa) can be increased if the voltage drop (IR drop) of the power line (VDD) is needed to be taken into consideration and the number of the second auxiliary power lines (VSS) can be increased if the voltage drop of the cathode is needed to be taken into consideration.

As described above, according to the OELD device according to the present invention and the method of manufacturing the OELD device, the voltage drop of the power line (VDD) and the voltage drop of the cathode can be reduced at the same time by using a first auxiliary power line and a second auxiliary power line. The non-uniform brightness and image characteristics of the OELD device can be prevented by preventing the voltage drop of the power line (VDD) and the voltage drop of the cathode.

A bus line for preventing the voltage drop can be formed, without an additional masking process, by forming the first and second auxiliary power lines at the time the anode is formed.

The present invention can provide an OELD device that has low power consumption and a large screen size by preventing the voltage drop of the power lines and the cathode, and can provide an improved lifetime and reliable OELD device.

While the present invention has been particularly shown and described with reference to exemplary embodiments thereof, it will be understood by those of ordinary skill in the art that various changes in form and details, such as addition, deletion, modification, or revision of elements that constitute the present invention, may be made therein without departing from the spirit and scope of the present invention as defined by the following claims.

For example, although one TFT is depicted in the drawings, a plurality of TFTs can be disposed on a practical plane according to a circuit design, the lower electrode can be used as an anode, the upper electrode can be used as a cathode, the location of electrodes can be easily changed, and therefore, all these modifications should considered with in the scope of the present invention.

What is claimed is:

1. An organic electroluminescence display device, comprising:
   a substrate;
   a thin film transistor formed on the substrate, said thin film transistor including source and drain electrodes;
   a first insulating layer formed on the thin film transistor;
   a lower electrode electrically connected to one of the source and drain electrodes of the thin film transistor and disposed on the first insulating layer;
   an auxiliary power line formed on the same layer as the lower electrode and electrically connected to the upper electrode;
   a second insulating layer formed on an edge portion of the lower electrode and not formed on at least a portion of the auxiliary power line to form an opening that exposes a portion of the lower electrode;
   an organic film formed on the substrate and preserving an exposure of at least a portion of a side surface of the portion of the auxiliary power line; and
   an upper electrode formed on the substrate.

2. The organic electroluminescence display device of claim 1, wherein the auxiliary power line is electrically connected to the upper electrode through the side surface of the portion of the auxiliary power line.

3. The organic electroluminescence display device of claim 1, wherein the lower electrode and the auxiliary power line are formed of the same material.

4. The organic electroluminescence display device of claim 3, wherein the lower electrode and the auxiliary power line are formed of a conductive material having a greater work function than a conductive material for forming the upper electrode.

5. The organic electroluminescence display device of claim 3, wherein the lower electrode and the auxiliary power line are formed of a material having a specific resistance of 1 to 20 $\mu\Omega$cm and reflectance of 70 to 99.9%.

6. The organic electroluminescence display device of claim 3, wherein the lower electrode and the auxiliary power line are formed as a single layer or a multiple layer.

7. The organic electroluminescence display device of claim 3, wherein the lower electrode and the auxiliary power line are formed of one selected from the group consisting of Al-ITO, Mo-ITO, Ti-ITO, and Ag-ITO.

8. The organic electroluminescence display device of claim 1, wherein the auxiliary power line has a greater thickness than the organic film.

9. The organic electroluminescence display device of claim 1, comprising:
   wherein the organic film preserves exposures of at least portions of a side surface and an upper surface of the portion of the auxiliary power line,
   the auxiliary power line is electrically connected to the upper electrode through the side surface and the upper surface of the portion of the auxiliary power line.

10. A method of manufacturing an organic electroluminescence display device, comprising:
    forming a lower electrode connected to one of source and drain electrodes of a thin film transistor on a substrate that includes the thin film transistor;
    forming an auxiliary power line on the same layer as the lower electrode;
    forming a pixel defining film on an edge portion of the lower electrode and not on at least a portion of the auxiliary power line to form an opening for exposing a portion of the lower electrode;
    forming an organic film on the substrate and exposing at least a portion of a side surface of the portion of the auxiliary power line; and
    forming an upper electrode on the substrate, the upper electrode being electrically connected to the auxiliary power line.

11. The method of claim 10, wherein the forming of the auxiliary power line includes:
    forming a planarizing film on the substrate;
    forming a via-hole that exposes the one of the source and drain electrodes in the planarizing film; and
    forming the lower electrode electrically connected to one of the source and drain electrodes through the via-hole on the planarizing film.

12. The method of claim 11, wherein the lower electrode, and the auxiliary power line formed on the planarizing film are formed of the same material.

13. The method of claim 11, wherein the lower electrode, and the auxiliary power line formed on the planarizing film are formed of a conductive material having a greater work function than a conductive material for forming the upper electrode.

14. The method of claim 11, wherein the lower electrode, and the auxiliary power line formed on the planarizing film are formed of a material having a specific resistance of 1 to 20 μΩcm and reflectance of 70 to 99.9%.

15. The method of claim 11, wherein the lower electrode, and the auxiliary power line are formed as a single layer or a multiple layer.

16. The method of claim 11, wherein the lower electrode, and the auxiliary power line are formed of one selected from the group consisting of Al-ITO, Mo-ITO, Ti-ITO, and Ag-ITO.

17. The method of claim 11, wherein the auxiliary power line has a greater thickness than the organic film.

18. The method of claim 10, wherein the auxiliary power line is electrically connected to the upper electrode through said side surface of the portion of the auxiliary power line.

19. The method of claim 10, wherein the auxiliary power line is electrically connected through the side surface and the upper surface of the portion of the auxiliary power line.

* * * * *